United States Patent [19]

Koike

[11] Patent Number: 4,978,954
[45] Date of Patent: Dec. 18, 1990

[54] NON-CONTACT TYPE POTENTIOMETER EMPLOYING A TRIANGULAR WAVE ENCODER

[75] Inventor: Kazumasa Koike, Iida, Japan

[73] Assignee: Tamagawa Seiki Kabushiki Kaisha, Tokyo, Japan

[21] Appl. No.: 335,597

[22] Filed: Apr. 10, 1989

[30] Foreign Application Priority Data

Dec. 1, 1988 [JP] Japan .................................. 63-302179

[51] Int. Cl.⁵ ............................................. H03M 1/22
[52] U.S. Cl. .......................................... 341/1; 341/13; 341/15
[58] Field of Search .......................... 341/1, 11, 13, 15

[56] References Cited

U.S. PATENT DOCUMENTS

| | | | |
|---|---|---|---|
| 3,238,361 | 3/1966 | Frisch ...................... | 341/1 |
| 4,072,893 | 2/1978 | Huwyler ................... | 341/15 |
| 4,631,539 | 12/1986 | Sanders et al. ............ | 341/13 |
| 4,803,354 | 2/1989 | Onodera et al. ........... | 341/13 |

*Primary Examiner*—Vit W. Miska
*Attorney, Agent, or Firm*—Brooks Haidt Haffner & Delahunty

[57] ABSTRACT

A non-contact type potentiometer employing a triangular wave encoder includes a triangular wave encoder for outputting a triangular wave signal consisting of a LEAD signal and a LAG signal having the phases different from each other. A pair of comparators are provided for waveforming the triangular wave signals into a pair of rectangular wave signals. An up/down signal converter is provided for converting each of the rectangular wave signals into up/down directive pulses, and an up/down counter is provided for receiving the directive pulses and outputting an absolute digital signal which is supplied to a D/A converter for converting the absolute digital signal into analog position step signals. An analog switch control circuit having a first switch and a second switch and supplied with the LEAD signal and a $\overline{\text{LEAD}}$ signal inverted from the LEAD signal is also turned on or off by being supplied with the rectuangular wave signals B obtained from the LAG signal and a rectangular wave signal $\overline{\text{B}}$ inverted from the rectangular wave signal B. An operational amplifier is provided for summing together the output signal from the analog switch control circuit and the analog position step signal. The above switches are controlled responsive to the high level of the rectangular wave signals to supple the LEAD signal or the $\overline{\text{LEAD}}$ signal to be summed with the analog position step signal to produce a linear analog potentiometer output signal from the operational amplifier.

1 Claim, 2 Drawing Sheets

3

NON-CONTACT TYPE POTENTIOMETER EMPLOYING A TRIANGULAR WAVE ENCODER

BACKGROUND OF THE INVENTION

This invention relates to a non-contact type potentiometer employing a triangular wave encoder and, more particularly, to a novel improvement allowing production of an highly accurate analog output signal having linear characteristics by a non-contact construction employing an encoder outputting a triangular wave signal.

PRIOR ART

There are a variety of this kind of potentiometers hitherto employed, although the identification of literature or publications showing the prior-art construction is not recited herein. As typical of these potentiometers, there is known an arrangement in which a brush is caused to slide on a resistor winding to produce a linear analog potentiometer output.

This type of prior-art potentiometer has the drawback that, since the brush was caused to slide on and contact with the winding resistor, the resistor winding was deteriorated in quality with lapse of time to lower the linear characteristics seriously. In addition, errors in the resistance increased due to noise generation and the brush had to be exchanged at a predetermined interval when the brush is needed for high precision control operations.

SUMMARY OF THE INVENTION

It is therefore an object of the present invention to provide a non-contact type potentiometer adapted to produce a high precision analog output signal having linear characteristics using an encoder outputting triangular wave signals.

According to the present invention, there is provided a non-contact type potentiometer employing a triangular wave encoder comprising a triangular wave encoder for outputting a triangular wave signal consisting of a LEAD signal and a LAG signal having phases different from each other, first and second comparators for waveforming respectively LEAD and LAG triangular wave signals into a corresponding pair said triangular wave signal into a pair of rectangular wave signals A and B, an up/down signal converter for converting each of said rectangular wave signals into up/down directive pulses, an up/down counter for receiving said directive pulses and outputting an absolute digital signal, a D/A converter for converting said absolute digital signal into an analog position step signal, an analog switch control circuit having a first switch and a second switch coupled respectively to be supplied with said LEAD signal and with a $\overline{\text{LEAD}}$ signal inverted from said LEAD signal while being coupled to an output of said second comparator to be turned on or off by being supplied with both the rectangular wave signal B obtained from the LAG signal and with a rectangular wave signal $\overline{B}$ inverted from said rectangular wave signal B, and an operational amplifier for summing together the output signal from said analog switch control signal circuit and said analog position step signal, wherein said switches are controlled responsive to the high level of said rectangular wave signals B and $\overline{B}$ to control said switches to supply the LEAD signal or the $\overline{\text{LEAD}}$ signal to be summed with said analog position step signal to produce a linear analog potentiometer output signal from said operational amplifier.

DESCRIPTION OF THE PREFERRED EMBODIMENT

Figure 1:
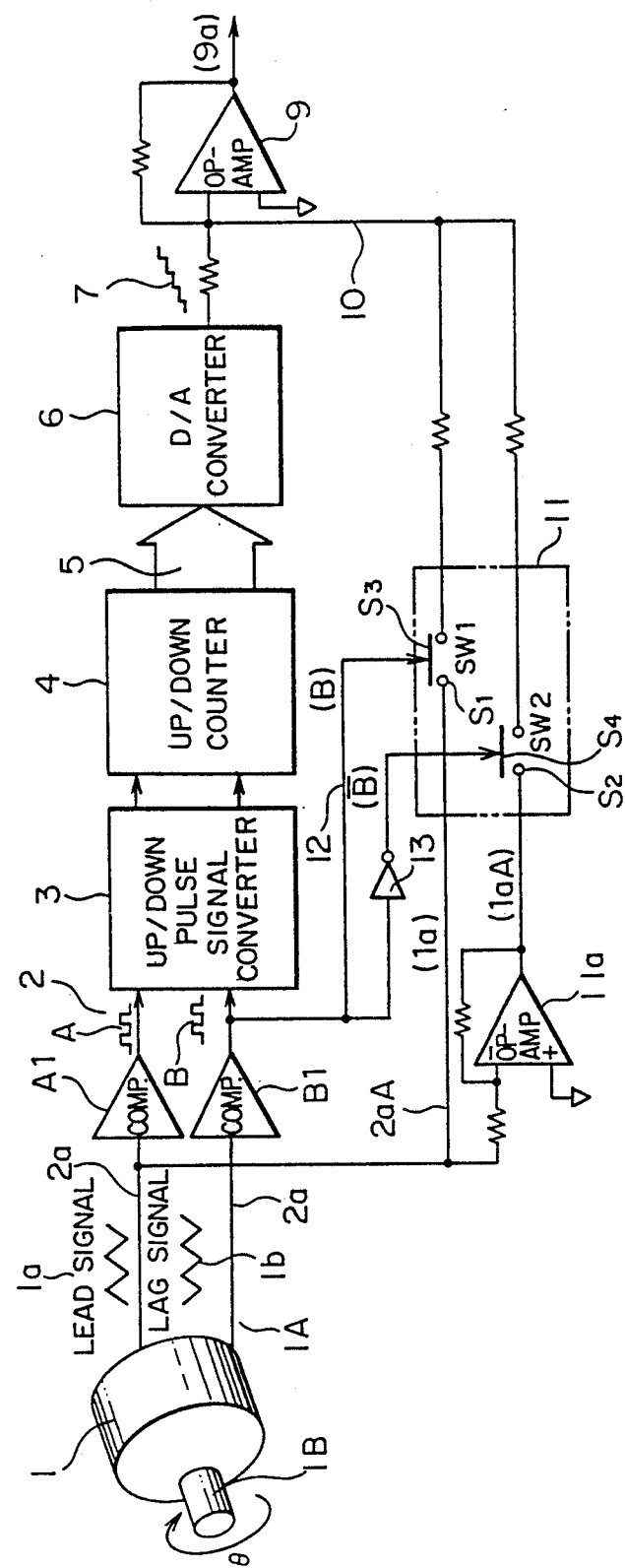
FIG. 1 is a block diagram showing a non-contact type potentiometer employing a triangular wave encoder according to the present invention.

By referring to the drawings, a non-contact potentiometer employing a triangular wave encoder according to a preferred embodiment of the present invention will be explained in detail.

Figure 2:
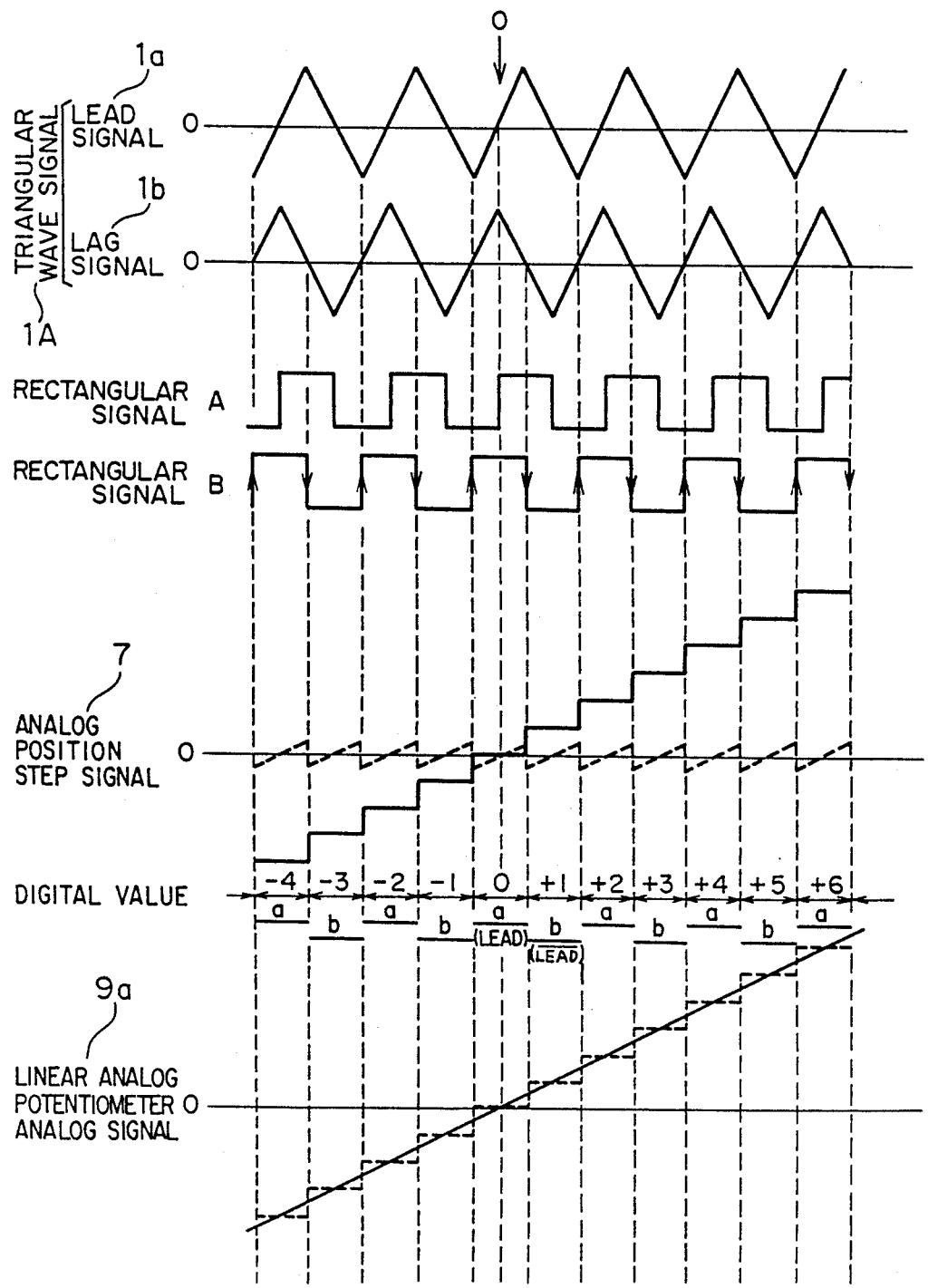
FIG. 2 is a waveform diagram for the non-contact type potentiometer shown in FIG. 1.

FIGS. 1 and 2 are a block diagram and a waveform diagram, respectively, for illustrating a non-contact type potentiometer employing a triangular wave encoder according to the present invention.

In these figures, the numeral 1 denotes an optical or magnetic triangular encoder having a rotary shaft 1B. When the shaft 1B of the triangular wave encoder 1 is revolved in the direction shown by an arrow mark θ, a LEAD signal 1a and a LAG signal 1b that make up a triangular wave signal 1A and that are phase shifted 90° from each other are introduced via jumper lines 2a to a pair of comparators A1 and B1. In these comparators A1 and B1, the signals 1a and 1b are waveshaped to position detection signals 2 composed of rectangular signals A and B corresponding to the LEAD and LAG signals 1a and 1b, respectively.

The position detection signals 2, that is, the rectangular signals A and B, are converted into corresponding up/down directive pulses by an up/down pulse signal converter 3, from which they are supplied to an up/down counter 4 where they are converted into an absolute digital signal 5.

This absolute digital signal 5 is outputted as analog position step signals 7 via a D/A converter 6, from which they are supplied to an operational amplifier 9.

An analog switch control circuit 11 having a first switch SW1 and a second switch SW2 is connected via a jumper wire 10 to the operational amplifier 9, so that the outputs of these switches SW1 and SW2 are supplied to the operational amplifier 9.

The aforementioned LEAD signal 1a is supplied to an input terminal S1 of the first switch SW1 A $\overline{\text{LEAD}}$ signal 1aA, which is an inversion signal of the LEAD signal 1a, is supplied via an operational amplifier 11a to an input terminal S2 of the aforementioned second switch SW2.

The aforementioned rectangular wave signal B is directly supplied via a jumper wire 12 to a gate S3 of the first switch SW1. A rectangular wave signal $\overline{B}$, obtained upon inverting the rectangular wave signal B at an inverter 13, is supplied to a gate S4 of the second switch SW2. These switches SW1 and SW2 are each constituted by an electronic switch that is turned on when the rectangular wave signals B and $\overline{B}$ at the gates S3 and S4 are at the "H" level.

The above described non-contact potentiometer employing the triangular encoder, which is constructed according to the present invention, operates in the following manner.

The LEAD and LAG signal, obtained from the triangular wave encoder 1, are wave shaped by the comparators A1 and B1 into the rectangular wave signals A and B shown in FIG. 2.

The rectangular wave signals A and B are transmitted to the up/down pulse signal converter 3, where the counting direction is determined. The signals A and B are then converted in the up/down counter 4 into the absolute digital signal 5

The aforementioned analog position signals 7 obtained upon D/A conversion in the D/A converter 6 from the absolute digital signal 5, are analog position step signals 7 having a frequency twice that of the original signal, and are supplied to the operational amplifier 9. The frequency doubling is achieved in such a manner that the rising and falling edges, indicated by the arrow marks in FIG. 2, of the rectangular wave signal B, evolved from the LAG signal 1b, are counted at the up/down counter 4, and the count value is converted in the D/A converter 6.

Simultaneously, for each domain a of the digital value of the analog position signal 7 corresponding to the "H" state of the rectangular wave signal B, the rectangular wave signal B is supplied to the first switch SW1, so that the first switch SW1 is turned on only during each domain a and hence the LEAD signal 1a is combined only during this time interval via the operational amplifier 9 with the analog position signal 7.

During each domain b of the digital value of the analog position signal 7 corresponding to the "L" state of the aforementioned rectangular wave signal B, the inverted rectangular signal $\overline{B}$ is supplied to the second switch SW2, so that the second switch SW2 is turned on only during each domain b and hence the inverted $\overline{LEAD}$ signal 1aA is supplied only during this time interval via the operational amplifier 9 with the analog position signal 7.

In this manner, a linear analog potentiometer analog signal 9a, corrected into the linear form, is obtained as an output signal from the operational amplifier 9, as shown at the bottom of FIG. 2.

What is claimed is:

1. A non-contact type potentiometer making use of a triangular wave encoder comprising
   a triangular wave encoder for outputting a triangular wave signal consisting of a LEAD signal and a LAG signal having phases different from each other, first and second comparators for waveforming respectively said LEAD and LAG triangular wave signals into a corresponding pair of rectangular wave signals A and B, and up/down signal converter for converting each of said rectangular wave signals into up/down directive pulses, an up/down counter for receiving said directive pulses and outputting an absolute digital signal, a D/A converter for converting said absolute digital signal into an analog position step signal, an analog switch control circuit having a first switch and a second switch coupled respectively to be supplied with said LEAD signal and with a $\overline{LEAD}$ signal inverted from said LEAD signal while being coupled to an output of said second comparator to be turned on or off by being supplied with both said rectangular wave signal B obtained from said LAG signal and with a rectangular wave signal $\overline{B}$ inverted from said rectangular wave signal B, and an operational amplifier for summing together the output signal from said analog switch control circuit and said analog position step signal, wherein said switches are controlled responsive to the high level of said rectangular wave signals B and $\overline{B}$ to control said switches to supply said LEAD signal or said $\overline{LEAD}$ signal to be summed with said analog position step signal to produce a linear analog potentiometer output signal from said operational amplifier.

* * * * *

UNITED STATES PATENT AND TRADEMARK OFFICE
CERTIFICATE OF CORRECTION

PATENT NO. : 4,978,954
DATED : December 18, 1990
INVENTOR(S) : K. Koike It is certified that error appears in the above-identified patent and that said Letters Patent is hereby corrected as shown below:

In the Abstract, line 25, "supple" should read --supply--.

Column 1, line 25, "winding resistor" should read --resistor winding--; line 64, delete "signal" (first occurrence).

Column 2, line 49, after "SW1", insert period --.--.

Column 3, line 8, after "7" insert comma --,--.

Column 4, line 12 "and" should read --an--.

Signed and Sealed this

Seventh Day of July, 1992

*Attest:*

DOUGLAS B. COMER

*Attesting Officer*      Acting Commissioner of Patents and Trademarks